US012213291B2

(12) United States Patent
Coppola et al.

(10) Patent No.: US 12,213,291 B2
(45) Date of Patent: Jan. 28, 2025

(54) ENHANCED INTEGRATION OF POWER INVERTERS USING POLYMER COMPOSITE ENCAPSULATION

(71) Applicant: GM GLOBAL TECHNOLOGY OPERATIONS LLC, Detroit, MI (US)

(72) Inventors: Anthony Michael Coppola, Rochester Hills, MI (US); Erik Brandon Golm, Warren, MI (US); Alireza Fatemi, Canton, MI (US); Ming Liu, Shanghai (CN); Seongchan Pack, West Bloomfield Township, MI (US); Muhammad Hussain Alvi, Troy, MI (US); Ronald O. Grover, Jr., Northville, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 293 days.

(21) Appl. No.: 17/886,891

(22) Filed: Aug. 12, 2022

(65) Prior Publication Data
US 2024/0022179 A1 Jan. 18, 2024

(30) Foreign Application Priority Data
Jul. 12, 2022 (CN) .......................... 202210816119.0

(51) Int. Cl.
H05K 7/20 (2006.01)
B60L 15/00 (2006.01)
H02M 7/00 (2006.01)

(52) U.S. Cl.
CPC ........ *H05K 7/20927* (2013.01); *B60L 15/007* (2013.01); *H02M 7/003* (2013.01)

(58) Field of Classification Search
CPC ... H05K 7/20927; H02M 7/003; B60L 15/007
See application file for complete search history.

(56) References Cited

U.S. PATENT DOCUMENTS 6,661,659 B2 * 12/2003 Tamba ............... H05K 7/20927
165/80.4
8,369,100 B2 * 2/2013 Azuma ................ B60L 15/007
361/784

(Continued)

FOREIGN PATENT DOCUMENTS

CN 102355612 A 2/2012
DE 102016114324 A1 2/2017

(Continued)

OTHER PUBLICATIONS

Anthony M. Coppola et al.; U.S. Appl. No. 17/225,508, filed Apr. 8, 2021, entitled "Metal-Coated, Polymer-Encapsulated Electronics Modules and Methods for Making the Same", 33 pages.

(Continued)

*Primary Examiner* — Zachary Pape

(57) ABSTRACT

A power control system for an electric vehicle includes a power inverter comprising a switch module including a plurality of power switches, a controller board, and a gate driver board in communication with the controller board and configured to drive gates of the plurality of switches. A first housing is made of polymer composite, encloses the power inverter, defines a first cooling cavity in thermal communication with a first surface of the switch module, and encapsulates a portion of at least one of the switch module, the controller board and the gate driver board.

20 Claims, 10 Drawing Sheets

(56) References Cited

U.S. PATENT DOCUMENTS

| | | | |
|---|---|---|---|
| 8,416,574 B2* | 4/2013 | Tokuyama | H05K 1/0262 |
| | | | 165/80.4 |
| 9,474,191 B2* | 10/2016 | Higuma | H05K 7/20927 |
| 9,654,046 B2* | 5/2017 | Nakajima | B60K 6/48 |
| 10,744,682 B2 | 8/2020 | Ellison et al. | |
| 10,923,287 B1 | 2/2021 | Coppola et al. | |
| 11,147,193 B2 | 10/2021 | Coppola et al. | |
| 11,881,791 B2* | 1/2024 | Kim | H02K 11/33 |
| 2012/0091615 A1* | 4/2012 | Wenzel | B29C 43/34 |
| | | | 264/105 |
| 2019/0357386 A1 | 11/2019 | Coppola et al. | |
| 2021/0162672 A1 | 6/2021 | Coppola et al. | |
| 2022/0130735 A1 | 4/2022 | Coppola et al. | |

FOREIGN PATENT DOCUMENTS

| | | |
|---|---|---|
| DE | 102021111045 A1 | 4/2022 |
| EP | 3114913 B1 | 6/2020 |
| WO | WO-2019197048 A1 | 10/2019 |

OTHER PUBLICATIONS

Office Action dated May 3, 2023 for German Patent Application No. 102022119285.7; 6 pages.

\* cited by examiner

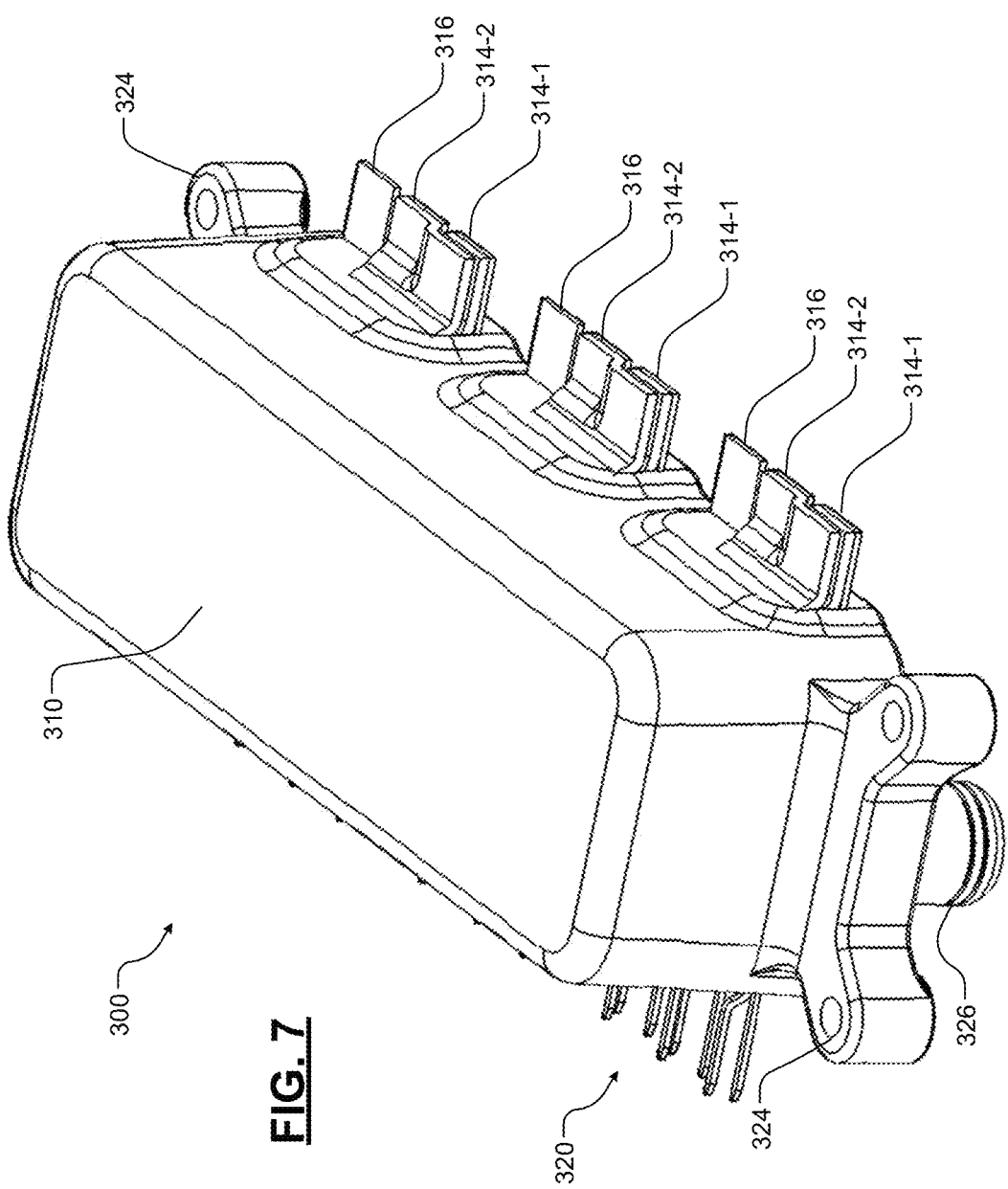

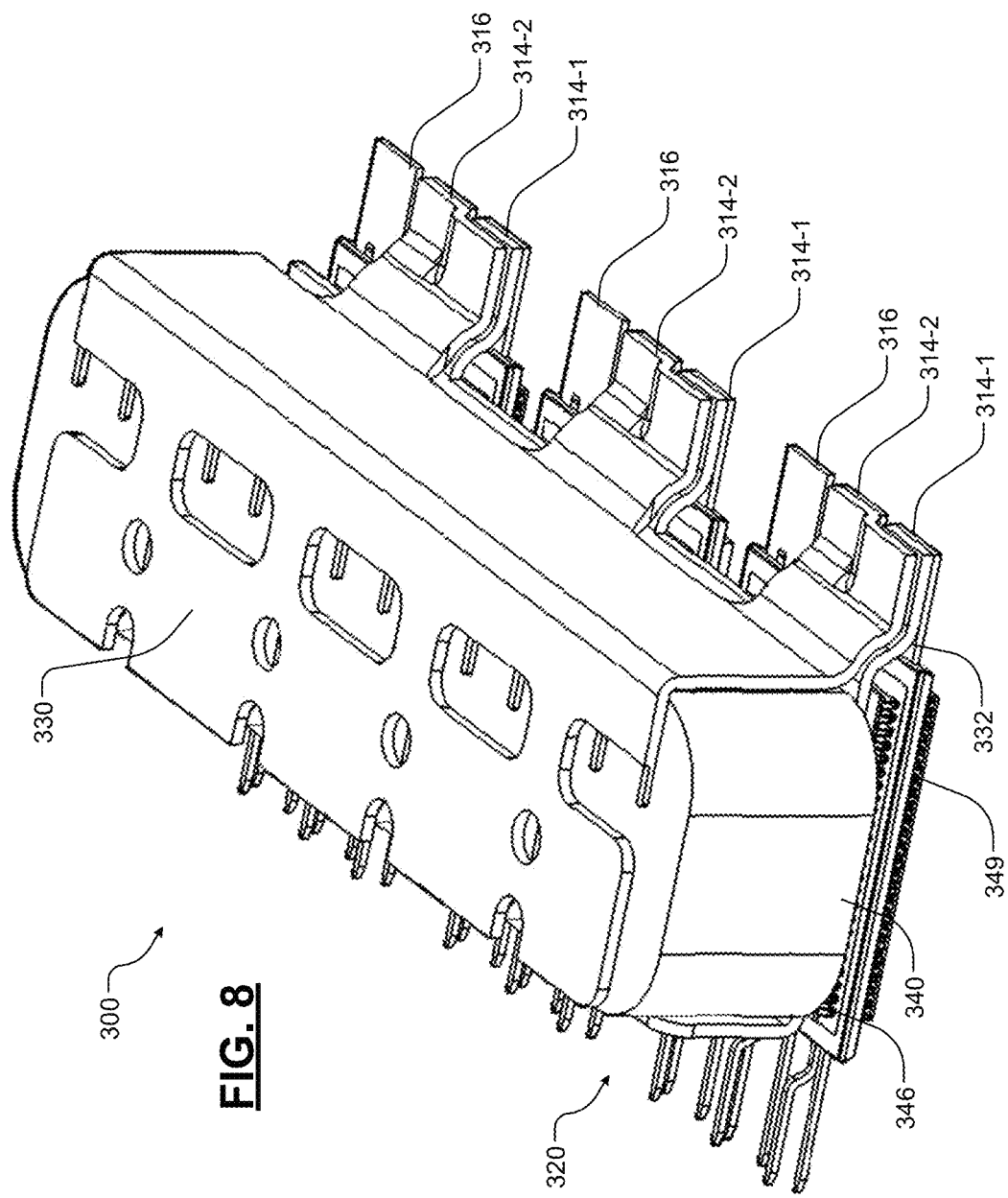

ENHANCED INTEGRATION OF POWER INVERTERS USING POLYMER COMPOSITE ENCAPSULATION

CROSS-REFERENCE TO RELATED APPLICATIONS

This application claims the benefit of Chinese Patent Application No. 202210816119.0, filed on Jul. 12, 2022. The entire disclosure of the application referenced above is incorporated herein by reference.

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to power inverters, and more particularly to integration of power inverters for electric vehicles.

Electric vehicles (EVs) such as battery electric vehicles (BEVs), hybrid vehicles, and/or fuel cell vehicles include one or more electric machines and a battery system including one or more battery cells, modules and/or packs. A power control system is used to control power to/from the battery system during charging, propulsion and/or regeneration.

The power control system includes a power inverter including DC capacitor, a gate driver, a controller, and a switch module including a plurality of power switches. The power inverter is arranged between the battery system and the electric machine. The DC capacitor is connected in parallel to the battery system and the input of the power inverter. During operation of the electric vehicle, the power switches are opened and closed to output power to the electric machine during propulsion and/or to absorb power from the electric machine during regeneration. The DC capacitor helps the battery system to absorb and release power.

Components of the power inverter are arranged within a housing. The components receive control signals and handle high DC and AC power signals. During operation, the components generate heat. Some of the components within the housing produce electromagnetic interference (EMI). Components of the power inverter are typically bolted together, which requires a significant number of fasteners and increases assembly cost. Further, there is little structural and/or thermal coupling.

SUMMARY

A power control system for an electric vehicle includes a power inverter comprising a switch module including a plurality of power switches, a controller board, and a gate driver board in communication with the controller board and configured to drive gates of the plurality of switches. A first housing is made of polymer composite, encloses the power inverter, defines a first cooling cavity in thermal communication with a first surface of the switch module, and encapsulates a portion of at least one of the switch module, the controller board and the gate driver board.

In other features, a conductive layer is arranged on greater than 80% of an outer surface of the first housing. The polymer composite comprises a polymer composite including the polymer composite and fillers. The first housing comprises greater than or equal to 50% of the polymer composite by volume. The polymer composite has a coefficient of thermal expansion in a predetermined range from 10 to 30 ppm/° C. The polymer composite has a dielectric strength that is greater than 20 kV/mm.

In other features, the first housing defines a second cooling cavity, wherein the second cooling cavity is in thermal communication with a second surface of the switch module. The switch module is arranged between the first cooling cavity and the second cooling cavity.

In other features, a DC bulk capacitor assembly includes a bulk capacitor and first and second DC busbars. The bulk capacitor and the first and second DC busbars are encapsulated in a second housing made of polymer composite. The second housing defines a second coolant cavity on an outer surface thereof that is in thermal communication with a second surface of the switch module.

In other features, a DC bulk capacitor assembly includes a bulk capacitor and first and second DC busbars. The bulk capacitor and the first and second DC busbars are encapsulated in the first housing. At least one of the first cooling cavity and the second cooling cavity includes a coating on an inner surface thereof to reduce permeability of the first housing to coolant. AC busbars connect the switch module to a load. The first housing includes slots on an inner surface thereof to receive the AC busbars. The first housing comprises vascular channels.

A power control system for an electric vehicle comprises a housing made of a polymer composite and including a conductive outer coating arranged on an outer surface of the polymer composite. A bulk capacitor assembly is arranged in the housing and includes a bulk capacitor and first and second DC busbars that are encapsulated in polymer composite. A power inverter is arranged in the housing and comprises a switch module including a plurality of switches, a controller board, and a gate driver board in communication with the controller board and configured to drive gates of the plurality of switches. AC busbars connect the switch module to a load.

In other features, conductive foam is arranged on an inner surface of the polymer composite. The conductive foam extends inwardly between the gate driver board and the bulk capacitor assembly. The conductive foam extends inwardly between the bulk capacitor assembly and the controller board. The housing comprises greater than or equal to 50% polymer composite by volume. The polymer composite has a coefficient of thermal expansion in a predetermined range from 10 to 30 ppm/° C. The polymer composite has a dielectric strength that is greater than 20 kV/mm. A shield is arranged between at least one of the controller board and the AC busbars, and the controller board and the bulk capacitor.

A power control system for an electric vehicle includes a power inverter including a controller board, a gate driver board, a switch module including a plurality of switches, and gate driver pins connected between the gate driver board and the switch module. AC busbars are connected to the switch module. A first housing is made at least partially of polymer composite. The first housing defines a first cooling cavity and a first cooling channel configured for connection to an external coolant source. At least one of the controller board and the gate driver board is encapsulated in the first housing. The switch module includes a first surface in thermal communication with the first cooling cavity. A conductive layer is arranged on greater than 80% of an outer surface of the first housing. A DC bulk capacitor assembly includes a bulk capacitor and first and second DC busbars. The bulk capacitor and the first and second DC busbars are encapsulated in a second housing made of polymer composite. The second housing defines a second coolant cavity on an outer surface thereof that is in thermal communication with a second surface of the switch module. The first housing comprises greater than or equal to 50% polymer composite by volume.

In other features, the polymer composite has a coefficient of thermal expansion in a predetermined range from 10 to 30 ppm/° C., and the polymer composite has a dielectric strength that is greater than 20 kV/mm.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 7 is a perspective view of an example of a housing for a power control system according to the present disclosure;

FIG. 8 is a perspective view of an example a power control system with the housing omitted according to the present disclosure;

In the drawings, reference numbers may be reused to identify similar and/or identical elements.

DETAILED DESCRIPTION

Figure 1:
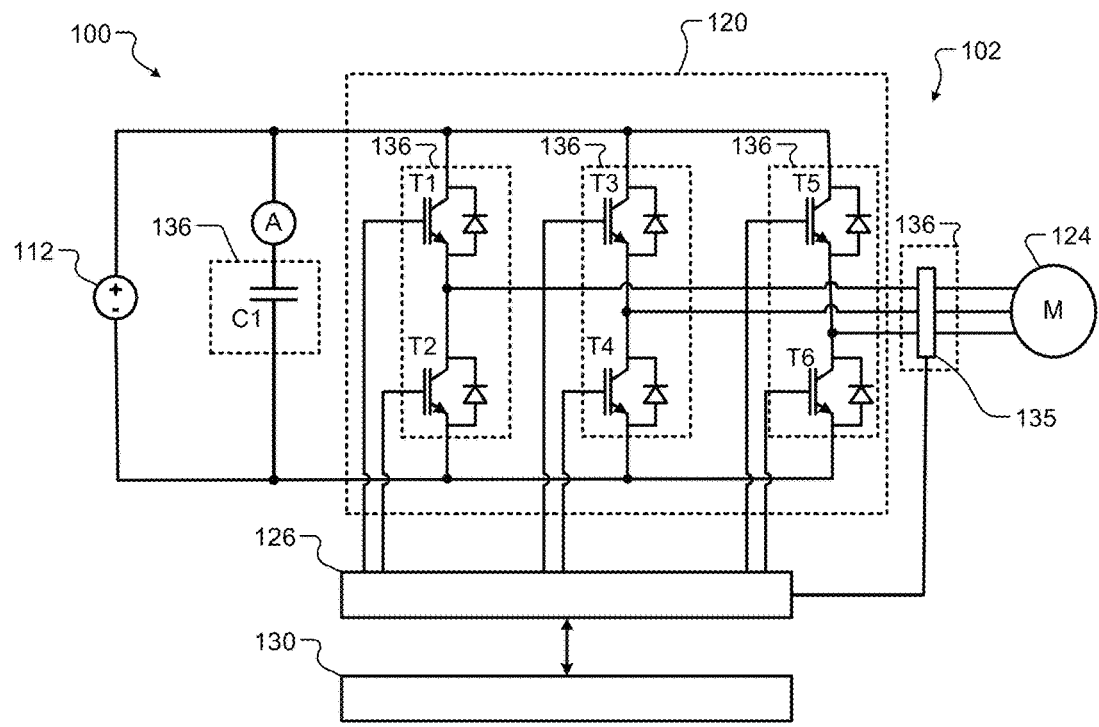
FIGS. 1 to 3 are functional block diagrams and schematics of a power control system for an electric vehicle according to the present disclosure.

A power control system for an electric vehicle (or other vehicular or non-vehicular application) includes a power inverter that transfers power between a battery system and a load (such as a electric machine). A high level of functional integration of components in the power inverter reduces mass, reduces volume, and/or improves performance. For example, a structural housing of the power inverter is formed using polymer composite. In some examples, the polymer composite encapsulates at least some of the components of the power control system and/or provides a mounting surface and/or cooling for components of the power inverter.

The structural housing further utilizes conductive materials such as conductive layers, conductive coatings and/or conductive foam where needed to provide EMI shielding, EMI absorption, and/or ground attachment points. In some examples, an inner surface of the housing and a facing surface of a bulk capacitor housing are used create cooling channels to perform double-sided cooling of the switch module including the power switches.

In some examples, the polymer composite that is used has low moisture absorption (e.g., moisture absorption less than 0.5% by mass). In some examples, the polymer composite has a low cure temperature (e.g., cure temperature less than 120° C.). In some examples, the polymer composite has a low molding pressure (e.g., molding pressure less than 20 MPa-) and high flowability during molding (e.g., flow length greater than 80 cm in ASTM D3123 Spiral Flow test). Use of encapsulation in polymer composite allows integration and/or elimination of components such as fasteners, housings, electrical isolators, clips, etc.

In some examples, the housing for the power inverter comprises greater than 50% polymer composite by volume. In some examples, the polymer is mixed with fillers inorganic (ceramic or mineral) fillers. In some examples, due to their higher density, the inorganic fillers may comprise up to 85% by weight of the polymer composite. The polymer may also be mixed with structural fibers such as glass fibers, carbon fibers, aramid fibers, etc.

In some examples, the housing includes one or more integrated cooling cavities for cooling the power inverter. In some examples, the housing includes a conductive coating and/or conductive layer on an exterior surface thereof to perform EMI shielding. In some examples, the housing encapsulates at least one electronic component of the power control system and has at least one other electronic component mounted on a surface thereof. In some examples, the polymer composite has a coefficient of thermal expansion between 10-30 ppm/° C. and dielectric strength>20 kV/mm.

In some examples, the power control system includes an encapsulated bulk capacitor and power inverter. In some examples, the encapsulated capacitor and power inverter include one or more cooling cavities that provide cooling to at least two surfaces of a switch module including a plurality of power switches. In some examples, an outer surface of the housing for the bulk capacitor forms at least 1 cooling cavity. In some examples, surfaces of the cooling cavity that are exposed to moisture are coated with a low moisture permeability coating (e.g., metallic or ceramic) to mitigate absorption of moisture. In some examples, the polymer composite increases capacitance of the system and thereby reduces capacitance that is needed from the dedicated bulk capacitor.

In some examples, a controller board and/or a gate driver board are encapsulated by polymer composite on a least 1 side thereof.

In other examples, a metallic sheet/bar/coating is attached to an outer surface of the inverter housing to act as an EMI shield and ground conductor. In other examples, a conductive coating is formed on an outside surface of the polymer composite housing and covers at least 80% or 90% of the exterior surface of the polymer composite housing. The conductive coating or layer is in electrical contact with ground or another reference potential to increase coverage of the EMI shield.

In some examples, the housing includes conductive foam arranged therein to absorb EMI signals. In some examples, the housing includes vascular channels within the polymer composite to reduce polymer composite mass or to provide cooling to electrical components such as the busbars.

Figure 2:
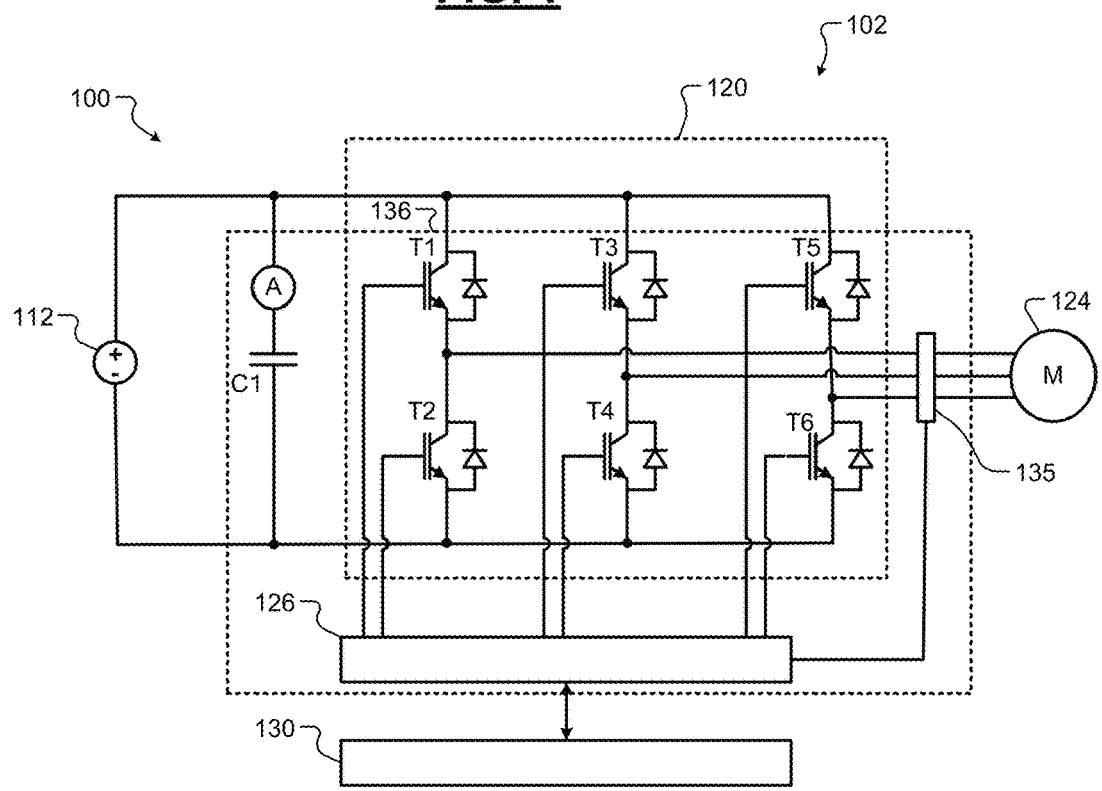
Figure 3:
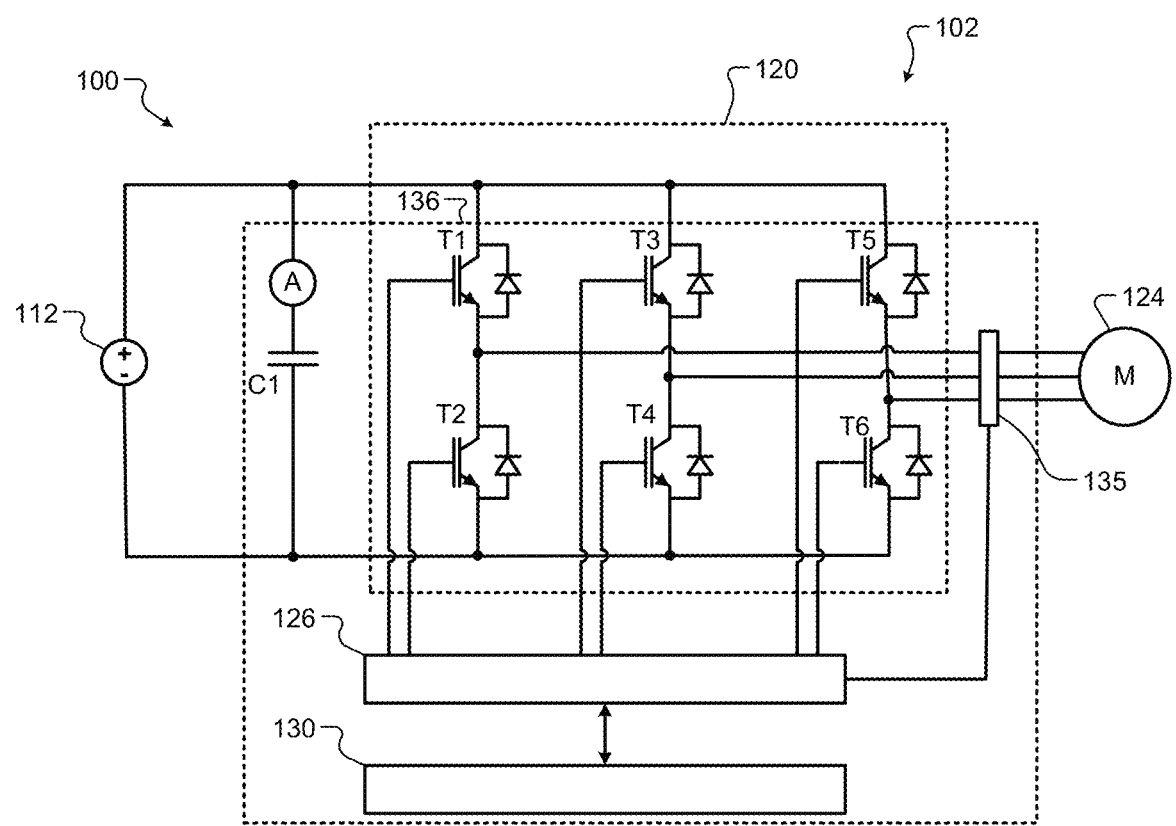

Referring now to FIGS. 1-3, various levels of integration of a power control system are shown. In FIG. 1, a power control system 100 includes a power inverter 102 connected to first and second terminals of a battery system 112. The battery system 112 includes one or more battery cells, modules and/or packs that are connected in series or parallel. The first and second terminals of the battery system 112 are connected to a switch module 120.

The switch module 120 includes 2P power switches where P is the number of phases. In this example, the electric machine is a three-phase electric machine (P=3) and the switch module 120 includes power switches T1, T2, T3, T4, T5, and T6. The power switches T1, T2 and T3 are connected to the first terminal of the battery system 112 and a first terminal of the capacitor C1. Second terminals of the power switches T1, T2 and T3 are connected to first, second and third phases of the electric machine 124, respectively, and to first terminals of the power switches T4, T5 and T6, respectively. Second terminals of the power switches T4, T5 and T6 are connected to the second terminal of the battery system 112 and the second terminal of the capacitor C1.

A gate driver 126 generates control signals for power switches T1, T2, T3, T4, T5, and T6. The gate driver 126 communicates with a controller 130 and a current sensor 135. The gate driver 126 is configured to generate control signals to open and close the power switches T1, T2, T3, T4, T5, and T6 as needed. The current sensor 135 senses current flowing through the AC busbars to the electric machine 124. The gate driver 126 controls the power switches T1, T2, T3, T4, T5, and T6 in response to sensed current. The controller 130 is configured to control the gate driver 126 in response commands from a vehicle bus.

The power control systems in FIGS. 1 to 3 have increasing levels of packaging integration. In FIG. 1, a typical level of integration is shown. The power switch pairs T1 and T2, T3 and T4, and T5 and T6 are separately encapsulated in polymer composite 136. Likewise, the capacitor C1 is separately encapsulated in polymer composite and the current sensor 135 is separately encapsulated in polymer composite 136.

In FIG. 2, an increasing level of packing integration is used according to the present disclosure. In this example, the power switches T1, T2, T3, T4, T5, and T6, the gate driver 126 and/or the current sensor 135 are encapsulated together in polymer composite 136. However different combinations of the components can be encapsulated together. In other examples, the power switches T1, T2, T3, T4, T5, and T6 and the current sensor 135 are encapsulated together in polymer composite 136 or the power switches T1, T2, T3, T4, T5, and T6 and the gate driver 126 are encapsulated in polymer composite.

In FIG. 3, the power switches T1, T2, T3, T4, T5, and T6, the gate driver 126, the current sensor 135 and the controller 130 are encapsulated together in polymer composite. As can be appreciated, encapsulating higher numbers of components reduces parts count.

Figure 4:
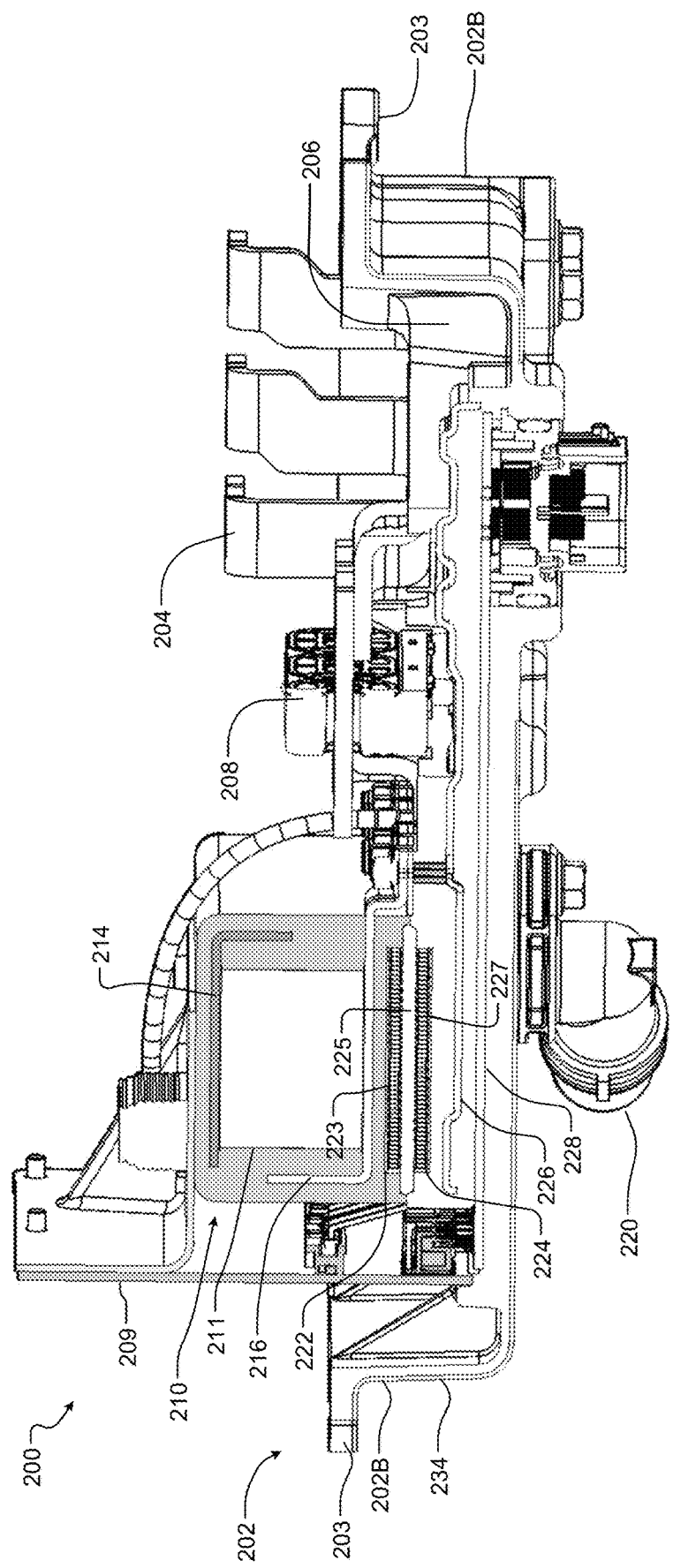
FIG. 4 is a side, perspective, cross-sectional view of an example of a housing for a power control system according to the present disclosure.
Figure 5:
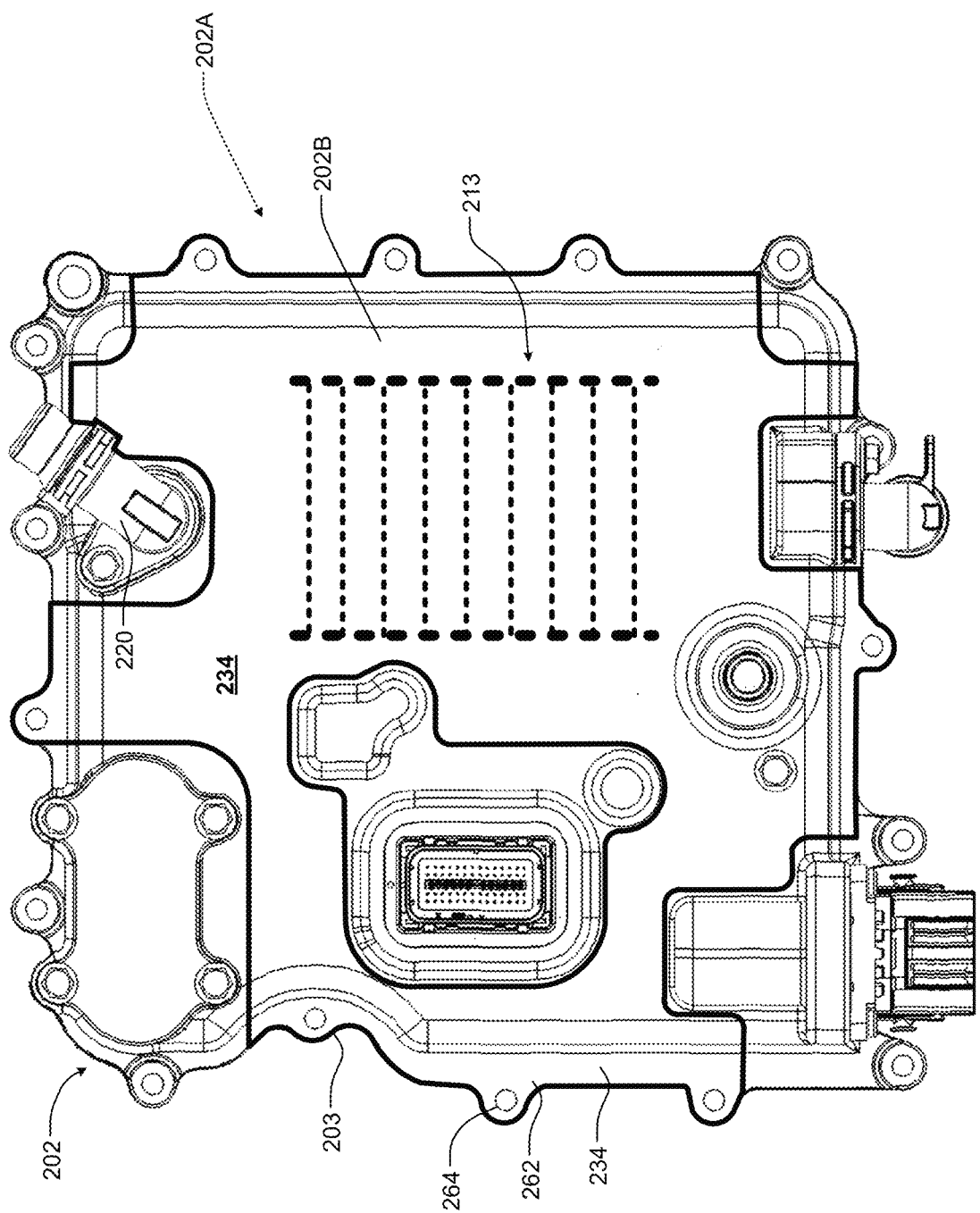
FIG. 5 is plan view of an example of surface of a housing for a power control system according to the present disclosure.
Figure 6:
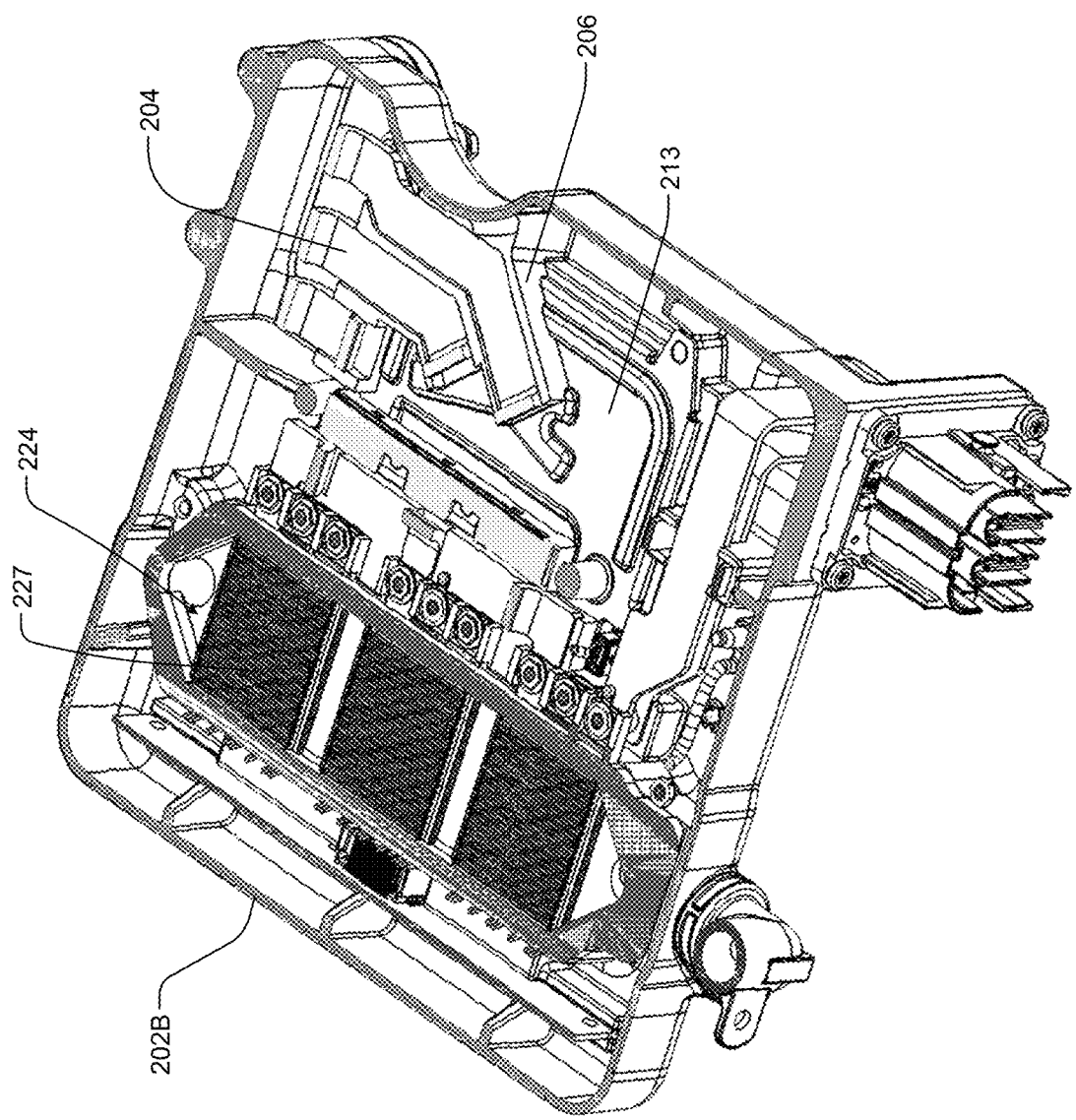
FIG. 6 is a side, perspective cross-sectional view of a housing for a power control system according to the present disclosure.

Referring now to FIGS. 4 to 6, an example of a power control system 200 is shown. In FIG. 4, the power control system 200 includes a housing 202 made at least partially of polymer composite. In some examples, the housing 202 includes structural fibers embedded in polymer composite for additional strength. The housing 202 includes a first housing portion 202A (FIG. 5) and a second housing portion 202B that are connected to form the housing 202 and to enclose the power inverter and related components. In some examples, flanges 203 extend from sides of the first housing portion 202A and the second housing portion 202B and include bores to receive fasteners.

The power control system 200 includes AC busbars 204 connecting the power switches to the electric machine 124. The second housing portion 202B includes slots 206 that are molded into an inner surface of the second housing portion 202B. The AC busbars 204 are mounted in the slots 206. The power control system 200 includes a current sensor 208 to sense current flowing through the AC busbars 204.

A bulk capacitor assembly 210 includes a bulk capacitor 211 and DC busbars 214 and 216 that are separately embedded in polymer composite. The additional polymer composite located between the DC busbars 214 and 216 and the bulk capacitor 211 increases the capacitance of the bulk capacitor 211, which may reduce the size of the bulk capacitor 211.

The bulk capacitor assembly 210 further includes a first cooling cavity 222 formed on a lower, outer portion of the bulk capacitor assembly 210. Cooling fins 223 are arranged in the cooling cavity 222 and are in thermal contact with a first or lower surface of a switch module 225. The switch module 225 is arranged between a first or inner surface of the second housing portion 202B and the first surface of the bulk capacitor assembly 210.

The inner surface of the second housing portion 202B defines a second cooling cavity 224 arranged adjacent to and in thermal contact with the switch module 225. Cooling fins 227 are arranged in the cooling cavity 224. Cooling fluid is supplied via a cooling cavity 222 through internal passages (not shown) in the housing 202 that are in fluid communication with the cooling cavities 222 and 224.

A shield 226 is embedded in the second housing portion 202B between the switch module 225 and an outer surface of the second housing portion 202B to provide shielding to reduce electromagnetic interference (EMI). In some examples, a controller 228 is also embedded in the second housing portion 202B between the shield 226 and the outer surface of the second housing portion 202B.

In FIGS. 4 and 5, shields 234 are formed over the first housing portion 202A and the second housing portion 202B. In some examples, the shields 234 include flanges 262 and bores 264 that align with some or all of the bores formed in the flanges 203 of the housing 202. The shield 234 include openings 250 arranged in locations where the cooling conduit 220 connects to the housing 202 and/or where connectors 254 to a controller board and/or a gate driver board are arranged. The shields 234 are grounded to chassis or another reference potential.

In FIGS. 4 and 6, the slots 206 are shown in further detail. The AC busbars 204 are arranged and mounted in the slots 206. The cooling cavity 224 is shown to include a plurality of the cooling fins 227 associated with each of the electric machine phases. Alternately, the cooling fins can extend the length of the cooling cavity 224.

In FIGS. 5 and 6, the housing 202 includes vascular channels 213. In FIG. 5, the vascular channels 213 (shown in dotted lines). The vascular channels 213 can be formed by encapsulating deflagratable material in predetermined patterns (or preforms) such as channels in the polymer composite. After encapsulation, the deflagratable material is ignited. Deflagration converts solid into gas. The gas escapes from the housing leaving cavities in the polymer composite in the shape of the predetermined patterns or preforms. In some examples, the deflagratable material has a shape corresponding to the predetermined patterns. The deflagratable material is attached to a solid support during encapsulation. Other suitable sacrificial materials could alternatively be used for forming the channels, including soluble or decomposable materials.

In some examples, the vascular channels 213 are arranged adjacent to the slots 206 and/or adjacent to the AC busbars or other components to allow cooling of the AC busbars. In other examples, the vascular channels 213 are arranged in other locations such as the housing of the bulk capacitor assembly. Cooling the busbars allows the size of the busbars to be reduced. In other words, lower temperatures correspond to lower resistance due to removal of heat by the vascular channels 213.

Additional details regarding vascular channels can be found in commonly assigned U.S. Pat. No. 10,923,827, issued on Feb. 16, 2021 and entitled "Vascular Cooled Capacitor Assembly and Method", U.S. Pat. No. 11,147,193, issued on Oct. 12, 2021 and entitled "Vascular Cooling System for Electrical Conductors"; US Patent Publ. No. 2019/0357386, published on Nov. 21, 2019 and entitled "Vascular Polymer Composite IC Assembly", and US Patent Publ. No. 2022/0130735, published on Apr. 28, 2022 and entitled "Package for Power Semiconductor Device and Method of Manufacturing Same", which are hereby incorporated by reference in their entirety.

Figure 9A:
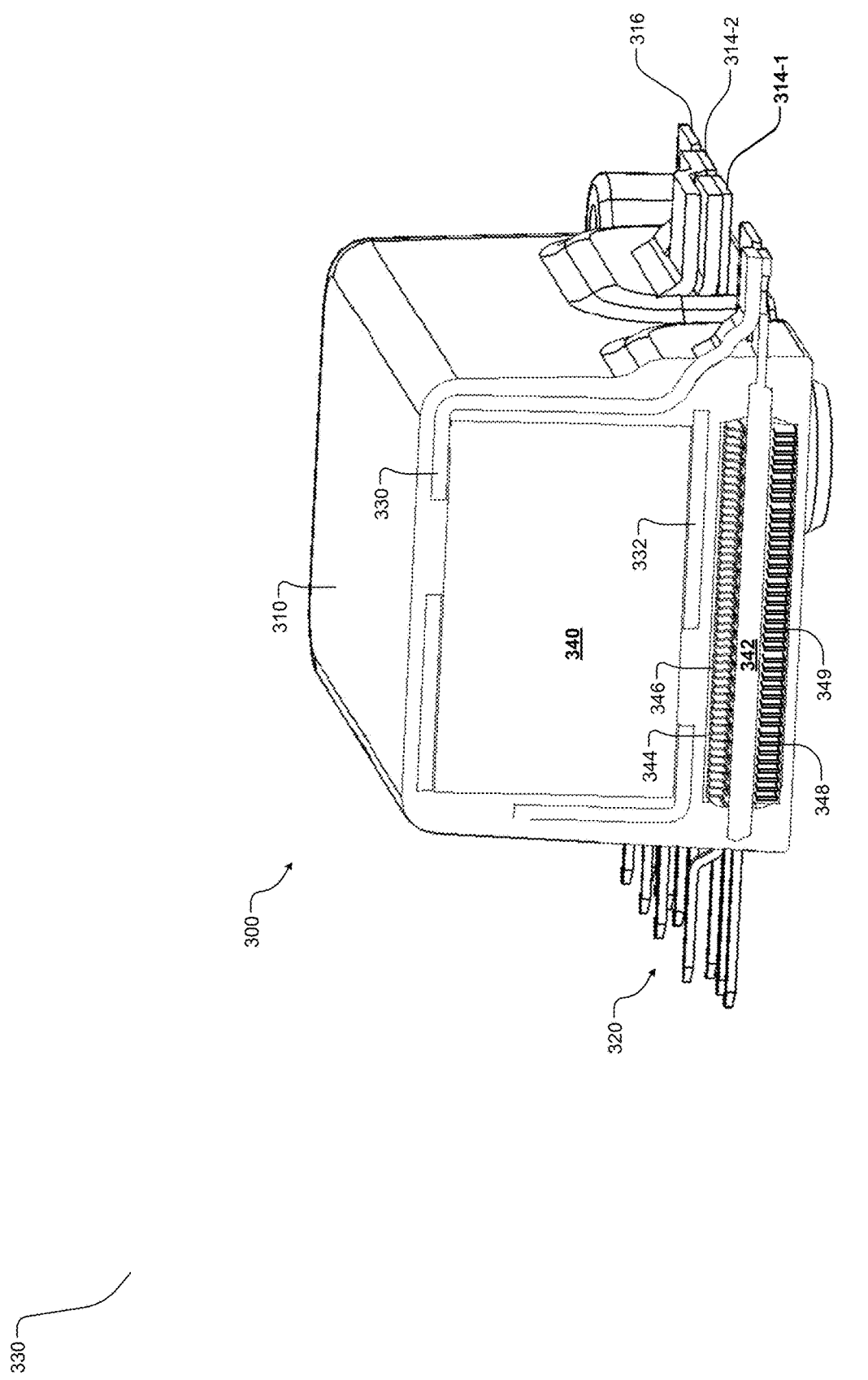
FIG. 9A is a side, perspective cross-sectional view of an example of a housing for a power control system according to the present disclosure.
Figure 9B:
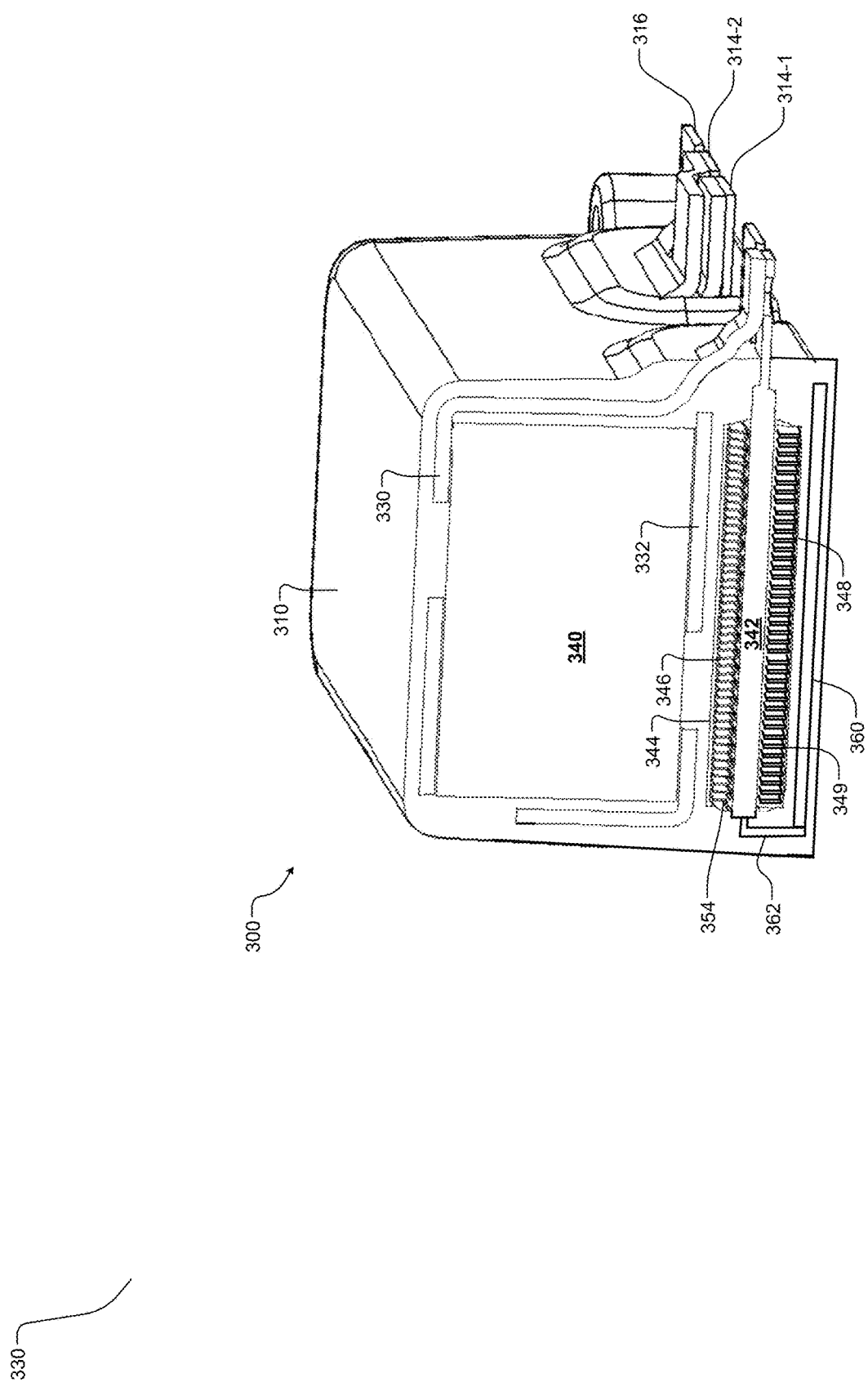
FIG. 9B is a side, perspective cross-sectional view of another example of a housing for a power control system according to the present disclosure.

Referring now to FIGS. 7 to 9B, additional details of a power inverter, coolant housing and capacitor system 300 is shown. In FIG. 7, the power inverter, coolant housing and capacitor system 300 is encapsulated in polymer composite 310. Each phase of the power inverter includes first and second DC terminals 314-1 and 314-2 and an AC terminal 316 extending from the polymer composite 310. Gate control pins 320 are connected from a gate control board (not shown in FIGS. 7, 8 and 9A) to a switch module 342 including a plurality of power switches. Alternately, the gate control board is integrated as well as shown in FIG. 9B.

A cooling conduit 326 supplies cooling fluid to cooling cavities formed in the polymer composite 310. In FIG. 8, DC busbars 330 and 332 extend around sides of a bulk capacitor 340. A cooling cavity 344 (FIG. 9) (formed in the polymer composite 310) and cooling fins 346 are arranged on a top surface of the switch module 342. A cooling cavity 348 (formed in the polymer composite 310) and cooling fins 349 are arranged on a bottom surface of the switch module 342. In FIG. 9B, a gate control board 360 and the gate control pins 362 are also integrated in the polymer composite 310.

Figure 10:
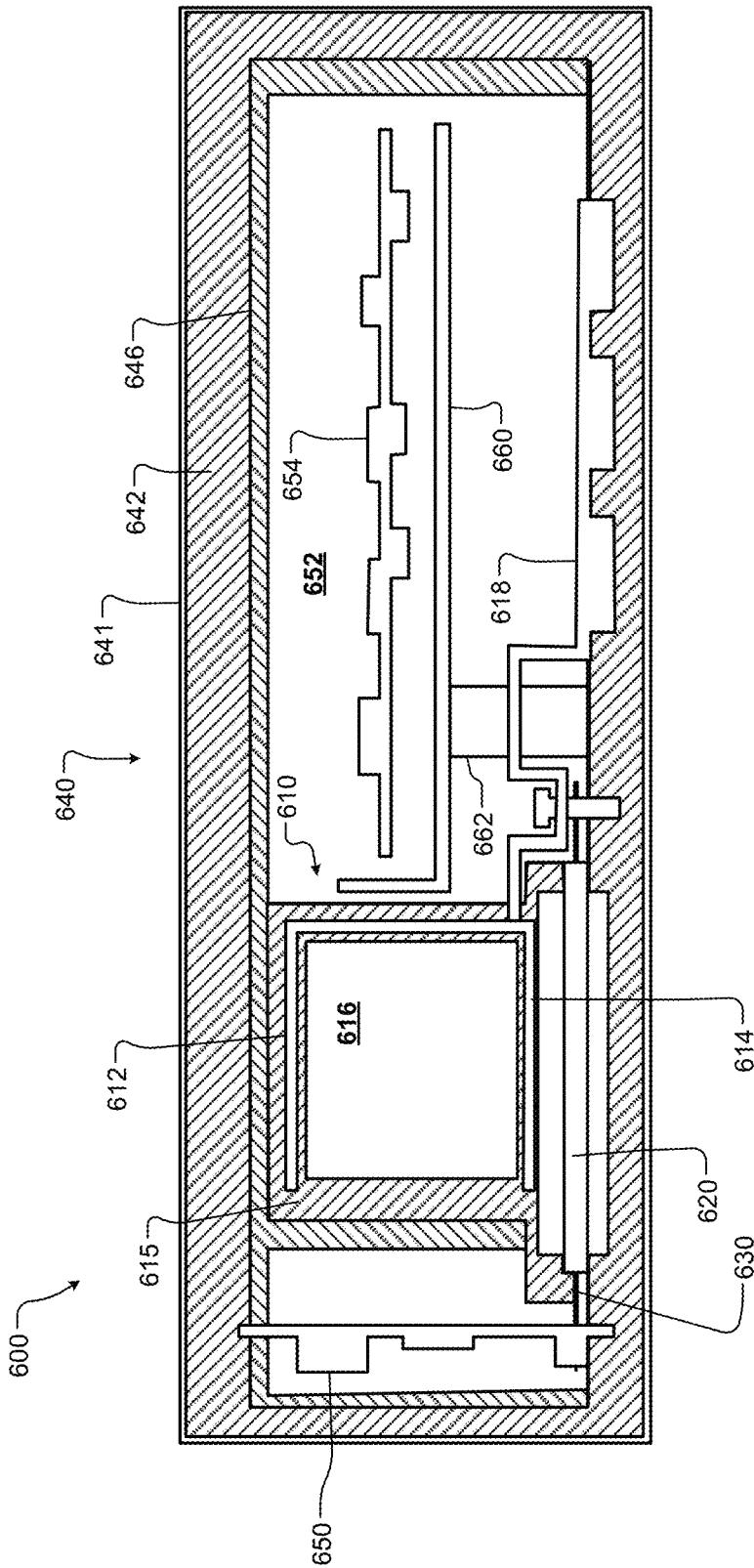
FIG. 10 is a side cross-sectional view of another example of a housing for a power control system according to the present disclosure.

Referring now to FIG. 10, a power control system 600 is shown to include a housing 640 including a conductive coating 641 applied to an outer surface of a polymer composite 642. In some examples, the conductive coating 641 increases reflectance of EMI signals. In some examples, the conductive coating 641 is formed by electroplating, electroless coating, cold spray and/or other coating techniques. The polymer composite 642 may be molded in a predetermined pattern to define a shape of the outer and inner surfaces, cavities, and/or other attachment features designed to receive or house components of the power control system.

The power control system 600 further includes a bulk capacitor assembly 610 arranged in the housing 640. The bulk capacitor assembly 610 includes a bulk capacitor 616 and DC busbars 612 and 614 that are encased in polymer composite 615. A switch module 620 is arranged between the bulk capacitor assembly 610 and the polymer composite 642. The switch module 620 is connected to AC busbars 618 that are connected to the phases of the electric machine 124, gate drive pins 630 connected to the gate driver board 650, and DC busbars 612 and 614. Cooling cavities can be arranged on opposite surfaces of the switch module 620.

Conductive foam 646 is arranged on an inner surface of the polymer composite 642 to absorb EMI. In some examples, the conductive foam 646 is thicker than the conductive coating 641. The conductive foam 646 extends between an outer surface of the gate driver board 650 and the polymer composite 642 and/or between the gate driver board 650 and the bulk capacitor assembly 610 to act as an absorbing material. In some examples, the conductive foam 646 has an "E"-shaped cross-section. In some examples, the conductive foam 646 and the conductive coating 641 are connected to ground. While the conductive foam 646 primarily acts as an absorbing layer and the conductive coating 641 primarily acts as a reflecting layer, both provide reflection and absorption functionality.

A cavity 652 is formed inside of the outer housing 640 to receive the components. A controller board 654 is arranged in the cavity 652 adjacent to a shield 660. The shield 660 is arranged between the controller 654 and/or the AC busbars 618 and between the controller 654 and the bulk capacitor assembly 610. In some examples, the shield 660 is "L"-shaped. In some examples, a spacer 662 supports the shield 660 in position above the AC busbars 618 and below the controller 654.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A power control system for an electric vehicle, comprising:
   a power inverter comprising:
      a switch module including a plurality of power switches;
      a controller board; and
      a gate driver board in communication with the controller board and configured to drive gates of the plurality of power switches;
   a first housing made of polymer composite, enclosing the power inverter, defining a first cooling cavity in thermal communication with a first surface of the switch module, and encapsulating a portion of at least one of the switch module, the controller board and the gate driver board; and
   a conductive layer arranged on greater than 80% of an outer surface of the first housing.

2. The power control system of claim 1, wherein:
   the polymer composite comprises a polymer composite including the polymer composite and fillers;
   the first housing comprises greater than or equal to 50% of the polymer composite by volume;
   the polymer composite has a coefficient of thermal expansion in a predetermined range from 10 to 30 ppm/° C.; and
   the polymer composite has a dielectric strength that is greater than 20 kV/mm.

3. The power control system of claim 1, wherein the first housing defines a second cooling cavity, wherein the second cooling cavity is in thermal communication with a second surface of the switch module.

4. The power control system of claim 3, wherein the switch module is arranged between the first cooling cavity and the second cooling cavity.

5. The power control system of claim 4, further comprising a DC bulk capacitor assembly including:
   a bulk capacitor; and first and second DC busbars,
  wherein the bulk capacitor and the first and second DC busbars are encapsulated in the first housing.

6. The power control system of claim 1, further comprising a DC bulk capacitor assembly including:
  a bulk capacitor; and
  first and second DC busbars,
  wherein the bulk capacitor and the first and second DC busbars are encapsulated in a second housing made of polymer composite, and
  wherein the second housing defines a second coolant cavity on an outer surface thereof that is in thermal communication with a second surface of the switch module.

7. The power control system of claim 6, wherein at least one of the first cooling cavity and the second cooling cavity includes a coating on an inner surface thereof to reduce permeability of the first housing to coolant.

8. The power control system of claim 1, further comprising AC busbars connecting the switch module to a load, wherein the first housing includes slots on an inner surface thereof to receive the AC busbars.

9. The power control system of claim 1, wherein the first housing comprises vascular channels.

10. The power control system of claim 1, further comprising conductive foam arranged on an inner surface of the first housing.

11. A power control system for an electric vehicle, comprising:
  a housing made of a polymer composite and including a conductive outer coating arranged on an outer surface of the polymer composite,
  a bulk capacitor assembly arranged in the housing and including a bulk capacitor and first and second DC busbars that are encapsulated in polymer composite; and
  a power inverter arranged in the housing and comprising:
    a switch module including a plurality of power switches;
    a controller board; and
    a gate driver board in communication with the controller board and configured to drive gates of the plurality of power switches; and
    AC busbars connecting the switch module to a load.

12. The power control system of claim 11, further comprising conductive foam arranged on an inner surface of the housing.

13. The power control system of claim 12, wherein the conductive foam extends inwardly between the gate driver board and the bulk capacitor assembly.

14. The power control system of claim 12, wherein the conductive foam extends inwardly between the bulk capacitor assembly and the controller board.

15. The power control system of claim 11, wherein the housing comprises greater than or equal to 50% polymer composite by volume.

16. The power control system of claim 15, wherein the polymer composite has a coefficient of thermal expansion in a predetermined range from 10 to 30 ppm/° C.

17. The power control system of claim 15, wherein the polymer composite has a dielectric strength that is greater than 20 kV/mm.

18. The power control system of claim 11, further comprising a shield arranged between at least one of:
  the controller board and the AC busbars, and
  the controller board and the bulk capacitor.

19. A power control system for an electric vehicle, comprising:
  a power inverter including a controller board, a gate driver board, a switch module including a plurality of switches, and gate driver pins connected between the gate driver board and the switch module;
  AC busbars connected to the switch module;
  a first housing made at least partially of polymer composite, wherein:
    the first housing defines a first cooling cavity and a first cooling channel configured for connection to an external coolant source;
    at least one of the controller board and the gate driver board is encapsulated in the first housing; and
  wherein the switch module includes a first surface in thermal communication with the first cooling cavity; and
  a conductive layer arranged on greater than 80% of an outer surface of the first housing; and
  a DC bulk capacitor assembly including:
    a bulk capacitor; and
    first and second DC busbars,
    wherein the bulk capacitor and the first and second DC busbars are encapsulated in a second housing made of polymer composite, and
    wherein the second housing defines a second coolant cavity on an outer surface thereof that is in thermal communication with a second surface of the switch module,
  wherein the first housing comprises greater than or equal to 50% polymer composite by volume.

20. The power control system of claim 19, wherein:
  the polymer composite of the first housing has a coefficient of thermal expansion in a predetermined range from 10 to 30 ppm/° C., and
  the polymer composite of the first housing has a dielectric strength that is greater than 20 kV/mm.

* * * * *